United States Patent
In et al.

(10) Patent No.: US 7,421,624 B2
(45) Date of Patent: Sep. 2, 2008

(54) DATA RECOVERY APPARATUS AND METHOD USED FOR FLASH MEMORY

(75) Inventors: Ji-hyun In, Seongnam-si (KR); Hyo-jun Kim, Seoul (KR); Kwang-yoon Lee, Seongnam-si (KR); Tae-sun Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 605 days.

(21) Appl. No.: 11/037,047

(22) Filed: Jan. 19, 2005

(65) Prior Publication Data

US 2005/0157561 A1 Jul. 21, 2005

(30) Foreign Application Priority Data

Jan. 19, 2004 (KR) .................. 10-2004-0003980

(51) Int. Cl.
*G06F 11/00* (2006.01)
(52) U.S. Cl. .................. 714/53; 714/42; 714/756; 711/144
(58) Field of Classification Search .............. 714/53
See application file for complete search history.

(56) References Cited

U.S. PATENT DOCUMENTS

| | | | | |
|---|---|---|---|---|
| 6,098,190 A * | 8/2000 | Rust et al. | ............ | 714/763 |
| 6,295,619 B1 * | 9/2001 | Hasbun et al. | ............ | 714/719 |
| 6,427,186 B1 * | 7/2002 | Lin et al. | ............ | 711/103 |
| 7,047,363 B2 * | 5/2006 | Machimura et al. | ......... | 711/128 |
| 2003/0126374 A1 * | 7/2003 | Bull et al. | ............ | 711/144 |
| 2005/0157561 A1 * | 7/2005 | In et al. | ............ | 365/185.29 |
| 2006/0085623 A1 * | 4/2006 | Kim et al. | ............ | 711/202 |

FOREIGN PATENT DOCUMENTS

| | | |
|---|---|---|
| JP | 11-65941 A | 3/1999 |
| JP | 11-282765 A | 10/1999 |
| JP | 2000-293440 A | 10/2000 |
| JP | 2003-015929 A | 1/2003 |
| KR | 1998-026498 A | 7/1998 |
| KR | 10-0206186 A | 4/1999 |
| KR | 2003-0040817 A | 5/2003 |
| KR | 2003-0043691 A | 6/2003 |

* cited by examiner

*Primary Examiner*—Christopher S McCarthy
(74) *Attorney, Agent, or Firm*—Sughrue Mion, PLLC

(57) ABSTRACT

A data recovery apparatus and method used for a flash memory, which can recover data damaged or lost when power supplied to the flash memory is cut off while data operations are being consecutively performed on at least one data stored in the flash memory. The data recovery apparatus performs a data operation at each of a plurality of consecutive logical addresses, and if the data operations performed at the logical addresses are successful, records a mark value in a last index area of a plurality of consecutive index areas respectively corresponding to the consecutive logical addresses.

16 Claims, 15 Drawing Sheets

FIG. 3

| | |
|---|---|
| LOGICAL ADDRESS 0 | 0 |
| LOGICAL ADDRESS 1 | 0 |
| LOGICAL ADDRESS 2 | 0 |
| LOGICAL ADDRESS 3 | 0 |
| LOGICAL ADDRESS 4 | 0 |
| LOGICAL ADDRESS 5 | 0 |
|  | 1 |
| ⋮ | ⋮ |

| | |
|---|---|
| LOGICAL ADDRESS 0 | 1 |
| LOGICAL ADDRESS 1 | 1 |
| LOGICAL ADDRESS 2 | 1 |
| LOGICAL ADDRESS 3 | 1 |
| LOGICAL ADDRESS 4 | 1 |
| LOGICAL ADDRESS 5 | 0 |
| | 1 |
| | 1 |
| | 1 |
| | 1 |

| LOGICAL ADDRESS 0 | LOGICAL ADDRESS 1 | LOGICAL ADDRESS 2 | LOGICAL ADDRESS 3 | 1 | 1 | 1 | 1 | | | | |
|---|---|---|---|---|---|---|---|---|---|---|---|
| LOGICAL ADDRESS 4 | LOGICAL ADDRESS 5 | LOGICAL ADDRESS 6 | LOGICAL ADDRESS 7 | 1 | 1 | 1 | 1 | | | | |
| LOGICAL ADDRESS 8 | LOGICAL ADDRESS 9 | LOGICAL ADDRESS 30 | LOGICAL ADDRESS 31 | 1 | 0 | 1 | 1 | | | | |
| LOGICAL ADDRESS 32 | LOGICAL ADDRESS 33 | LOGICAL ADDRESS 34 | LOGICAL ADDRESS 35 | 1 | 1 | 1 | 1 | | | | |
| LOGICAL ADDRESS 36 | LOGICAL ADDRESS 37 | LOGICAL ADDRESS 38 | LOGICAL ADDRESS 39 | 1 | 1 | 1 | 1 | | | | |
| LOGICAL ADDRESS 40 | LOGICAL ADDRESS 41 | LOGICAL ADDRESS 42 | | 1 | 1 | 0 | 1 | | | | |

630, 640

DATA RECOVERY APPARATUS AND METHOD USED FOR FLASH MEMORY

CROSS-REFERENCE TO RELATED APPLICATION

This application claims priority from Korean Patent Application No. 10-2004-0003980 filed on Jan. 19, 2004 in the Korean Intellectual Property Office, the disclosure of which is incorporated herein by reference in its entirety.

BACKGROUND OF THE INVENTION

1. Field of the Invention

The present invention relates to a data recovery apparatus and method used for a flash memory, and more particularly, to a data recovery apparatus and method used for a flash memory, which can recover data damaged or lost when power supplied to the flash memory is cut off while data operations are being consecutively performed on at least one data stored in the flash memory.

2. Description of the Related Art

In general, home appliances, communications devices, and embedded systems, such as set-top boxes, use non-volatile memories as storage devices for storing and processing data.

Among such non-volatile memories, flash memories are electrically-erasable and rewritable memories. Flash memories are suitable for portable devices because they consume less power than magnetic disc memory-based storage mediums, are as accessible as hard discs, and are compact-sized.

Due to the hardware characteristics of flash memories, data recorded on a flash memory should be erased before data is overwritten on the flash memory.

A unit in which data is recorded on a flash memory may differ from a unit in which data is erased from the flash memory, which may result in deterioration of the performance of the flash memory.

In order to prevent the performance of the flash memory from deteriorating for this reason, logical addresses and physical addresses have been suggested.

Here, logical addresses are virtual addresses specified by a user when executing a data operation on the flash memory using a program. By comparison, physical addresses are actual addresses referenced when executing the data operation on the flash memory.

Flash memory is generally classified into either a small block flash memory or a large block flash memory. In a small block flash memory, a logical operation unit is equal to a physical operation unit, whereas in a large block flash memory, a logical operation unit is smaller than a physical operation unit.

FIGS. 1A and 1B are schematic diagrams illustrating a small block flash memory and a large block flash memory, respectively.

Referring to FIG. 1A, logical computations of the small block flash memory are performed in units of a sector 11, and physical computations of the small block flash memory are performed in units of a page 12, which is as large as sector 11.

Referring to FIG. 1B, logical computations of the large block flash memory are performed in units of a sector 21, and physical computations of the large block flash memory are performed in units of a page 22, which is comprised of at least one sector 21.

In general, flash memory-based systems are comprised of a CPU and non-volatile memories, such as RAMs.

Here, the flash memory-based system may unexpectedly suffer from frequent power interruptions due to its characteristics.

Therefore, the flash memory-based system needs a function of recovering data damaged or lost due to a power interruption.

Specifically, when the power supplied to the flash memory-based system is cut off while data is being written to a flash memory in the flash memory-based system, some of the data may be successfully written to the flash memory, but the rest of the data may not.

Therefore, various methods to determine whether data written to a flash memory is complete have been suggested.

Of those methods, a method in which marks are used to indicate whether a data operation performed on a flash memory is complete will now be described more fully with reference to FIG. 2.

FIG. 2 is a flowchart of a conventional data recovery method used for a flash memory. Referring to FIG. 2, in operation S21, a data operation is performed at a predetermined logical address on a flash memory. In operation S22, if the data operation is complete, a mark indicating that the data operation performed at the predetermined logical address is complete is written to a predetermined area of the flash memory.

In other words, as shown in FIG. 3, if the flash memory is a small block flash memory, it may include a data area 31, in which a data computation is executed, and an index area 32, which indicates, with the use of marks, whether the data computation executed in the data area 31 is complete.

Like the small block flash memory, the large block flash memory may also have a data area and an index area.

In this case, if the data area 31 and the index area 32 are located in the same block of the flash memory, and a data erasure operation is performed on the block of the flash memory where the data area 31 and the index area 32 are located, the data area 31 and the index area 32 are all set to a value of 1.

In addition, if the data operation is performed on the data area 31 and the performance of the data operation is complete, the index area 32 is switched from 1 to 0 to indicate completion of the data operation on the block of the flash memory where the data area 31 and the index area 32 are located.

In operation S23, it is determined whether the data operation has already been performed at each of a plurality of consecutive logical addresses of the flash memory. In operation S24, if there are logical addresses that have not yet undergone the data operation, the data operation is performed at a logical address subsequent to the predetermined logical address, and then the method returns to operation S22.

When the data operation has been performed for all of the logical addresses of the flash memory, the flash memory may undergo a data validity test, which will now be described more fully with reference to FIG. 4.

In operation S41, a value of the index area 32 is identified. In operation S42, it is determined, based on the value of the index area 32, whether a data operation performed at a corresponding logical address is valid.

For example, if the value of the index area 32 is 0, the data computation performed at the corresponding logical address is determined valid. If the value of the index area 32 is 1, the data computation performed at the corresponding logical address is determined invalid.

However, according to conventional data recovery methods used for a flash memory, whenever a data operation is performed on the flash memory, a mark value indicating whether the data operation was successful should be recorded in a corresponding index area on the flash memory.

For example, if the data operation is sequentially performed in six data areas, the mark value should be sequentially recorded in index areas corresponding to the six data areas, which adds up to a total of twelve data computation operations.

Therefore, the conventional data recovery methods may undesirably increase the amount of data computation, thus deteriorating the performance of the flash memory.

SUMMARY OF THE INVENTION

An aspect of the present invention provides a data recovery apparatus and method used for a flash memory, which can recover data damaged or lost when power supplied to the flash memory is cut off while a data operation is being performed on the flash memory and can minimize the amount of data computation required for data recovery.

The above aspect as well as other features and advantages of the present invention will become clear to those skilled in the art upon review of the following description, the attached drawings and appended claims.

According to an aspect of the present invention, there is provided a data recovery apparatus used for a flash memory that includes data areas and index areas in which values indicating whether data stored in the respective data areas are valid are recorded, wherein the data recovery apparatus performs a data operation at each of a plurality of consecutive logical addresses, and if the data operations performed at the logical addresses are successful, records a mark value in a last index area of a plurality of consecutive index areas respectively corresponding to the consecutive logical addresses.

The data recovery apparatus may perform the data operation first on a middle portion of the flash memory and then on other portions of the flash memory, and recording the mark value in an index area corresponding to the middle portion of the flash memory.

According to another aspect of the present invention, there is provided a data recovery apparatus used for a flash memory that includes data areas and index areas in which values indicating whether data stored in the respective data areas are valid are recorded, wherein the data recovery apparatus determines whether data respectively stored at consecutive logical addresses ahead of a predetermined logical address through a data operation are valid based on a mark value recorded in an index area corresponding to the predetermined logical address.

The data recovery apparatus may record the mark value in index areas respectively corresponding to first and last logical addresses of a plurality of consecutive logical addresses when performing the data operation first on a middle portion of the flash memory and then on other portions of the flash memory.

In addition, it is preferably determined whether data stored at a predetermined logical address is valid based on whether data exists at a logical address subsequent to the predetermined logical address.

According to still another aspect of the present invention, there is provided a data recovery method used for a flash memory that includes data areas and index areas in which values indicating whether data stored in the respective data areas are valid are recorded, the data recovery method comprising performing a data operation at each of a plurality of consecutive logical addresses, and recording a mark value in a last index area of a plurality of index areas respectively corresponding to the consecutive logical addresses.

In the recording of the mark value, if the data operation is performed first on a middle portion of the flash memory and then on other portions of the flash memory, the mark value is preferably recorded in an index area corresponding to the middle portion of the flash memory.

According to a further aspect of the present invention, there is provided a data recovery method used for a flash memory that includes data areas and index areas in which values indicating whether data stored in the respective data areas are valid are recorded, the data recovery method comprising identifying a mark value recorded in an index area corresponding to a predetermined logical address, and determining whether data respectively stored at a plurality of consecutive logical addresses ahead of the predetermined logical address through a data operation are valid based on the mark value.

In the determining operation, it is preferably determined whether data respectively stored at a plurality of consecutive logical addresses are valid based on a mark value recorded in an index area corresponding to the logical address where the data operation has been most recently performed.

In addition, in the determining operation, if the data operation is performed first on a middle portion of the flash memory and then on other portions of the flash memory, it is preferably determined whether data stored in the flash memory are valid based on a mark value recorded in an index area corresponding to the middle portion of the flash memory.

Preferably, it is determined whether data stored at a predetermined logical address is valid based on whether data exists at a logical address subsequent to the predetermined logical address.

BRIEF DESCRIPTION OF THE DRAWINGS

An aspect of the above and other aspects of the present invention will become more apparent by describing in detail exemplary embodiments thereof with reference to the attached drawings in which:

FIG. 3 is a diagram illustrating a data area and an index area of a typical small block flash memory;

FIG. 9A is a diagram illustrating a method of recording a mark value in an index area of a small block flash memory, according to an exemplary embodiment of the present invention;

FIG. 9B is a diagram illustrating a method of recording a mark value in an index area of a large block flash memory, according to an exemplary embodiment of the present invention;

DETAILED DESCRIPTION OF EXEMPLARY EMBODIMENTS OF THE INVENTION

Figure 1A:
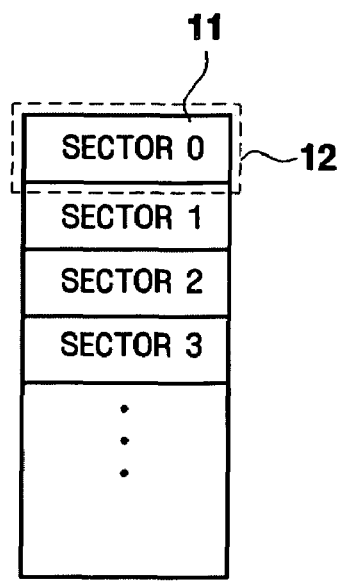
FIG. 1A is a diagram illustrating a typical small block flash memory.
Figure 1B:
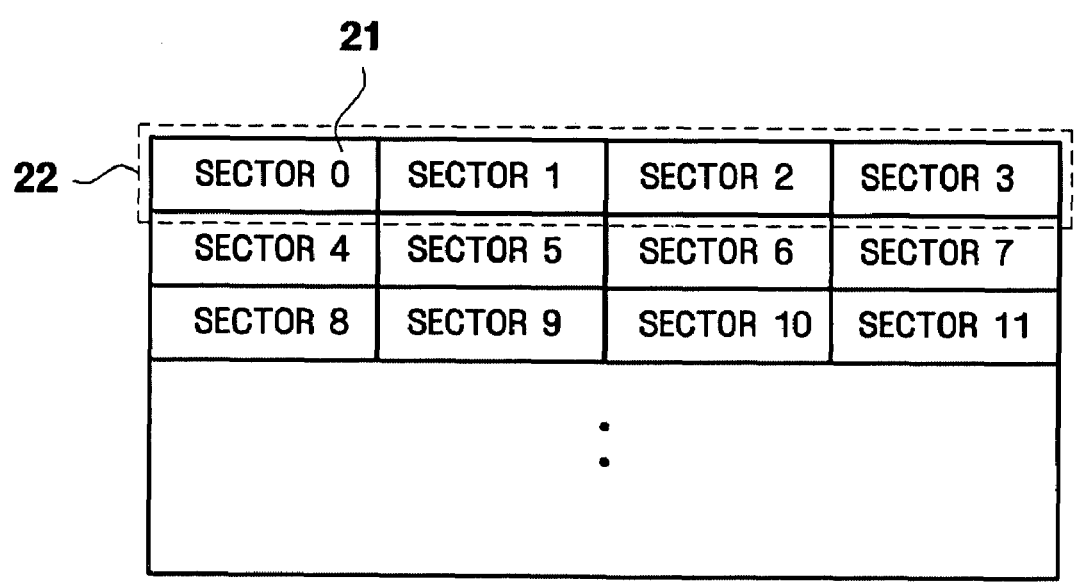
FIG. 1B is a diagram illustrating a typical large block flash memory.
Figure 2:
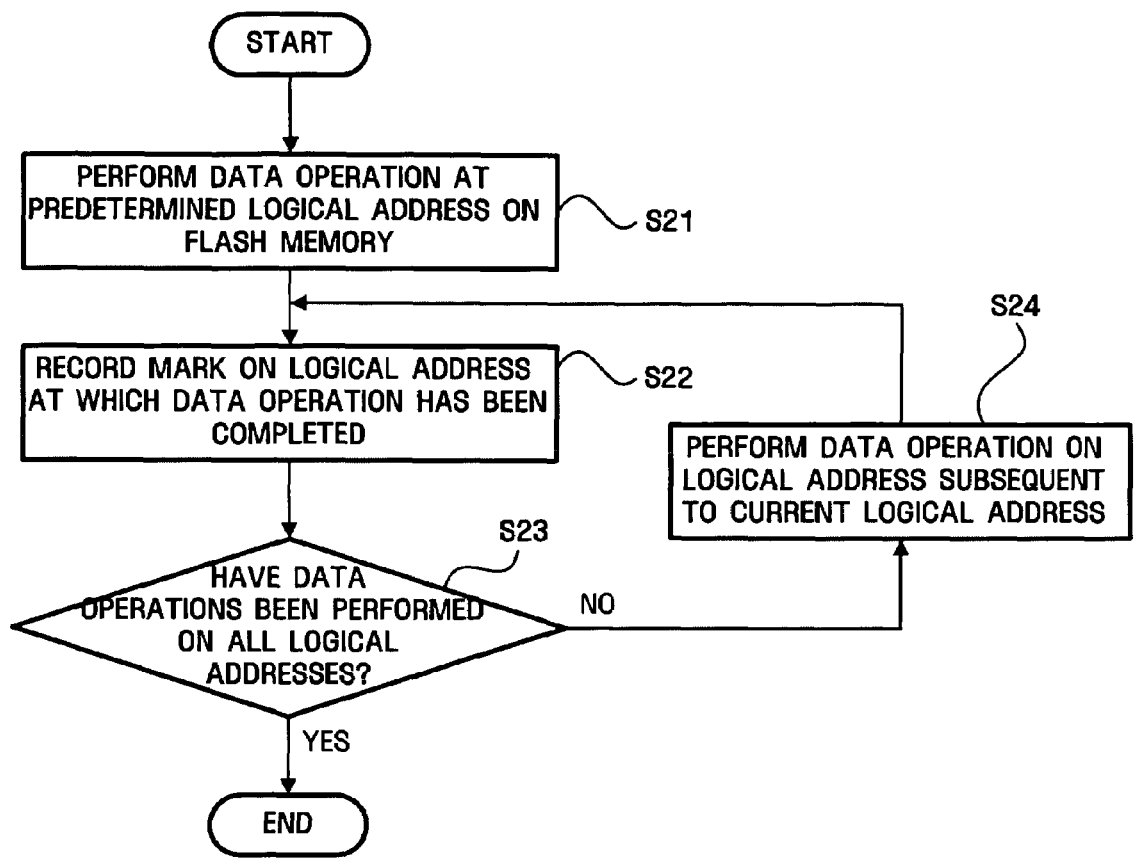
FIG. 2 is a flowchart of a conventional data recovery method used for a flash memory.
Figure 4:
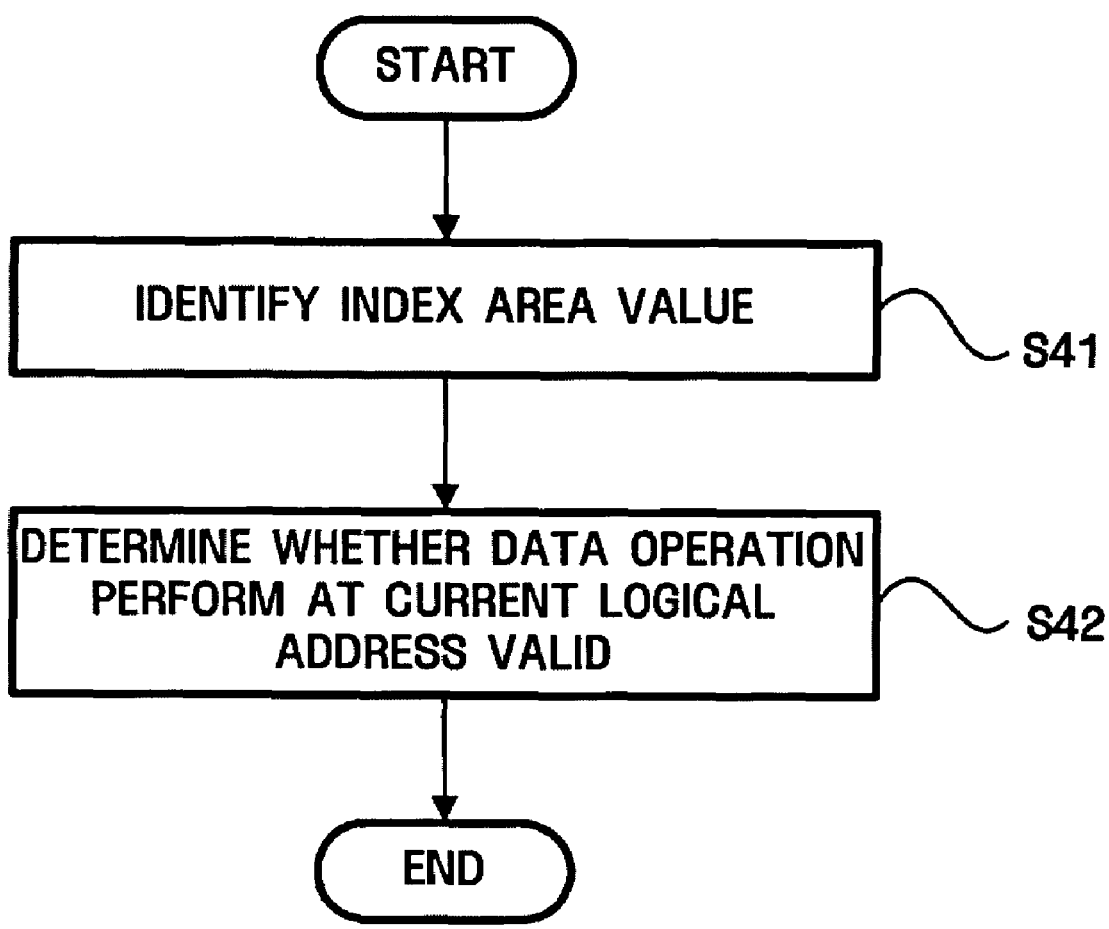
FIG. 4 is a flowchart of a conventional method of determining whether a data operation performed on a flash memory is valid.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The present invention will now be described more fully with reference to the accompanying drawings, in which exemplary embodiments of the invention are shown.

Flash memories can be generally categorized into small block flash memories and large block flash memories.

In the case of a small block flash memory, a physical operation unit and a logical operation unit are identical, whereas in the case of a large block flash memory, the physical operation unit is larger than the logical operation unit.

Here, the logical operation unit, called a sector, is a unit of data operation (e.g., read/write operations) that is performed on a flash memory using a user program.

The physical operation unit, often called a page, is an actual operation unit of the flash memory, on which the data operation is performed.

The logical and physical operation units are not limited to the sector and the page, respectively. In other words, units other than the sector and the page may be adopted as the logical and physical operation units of the flash memory depending on the type of system where the flash memory is used.

Figure 5:
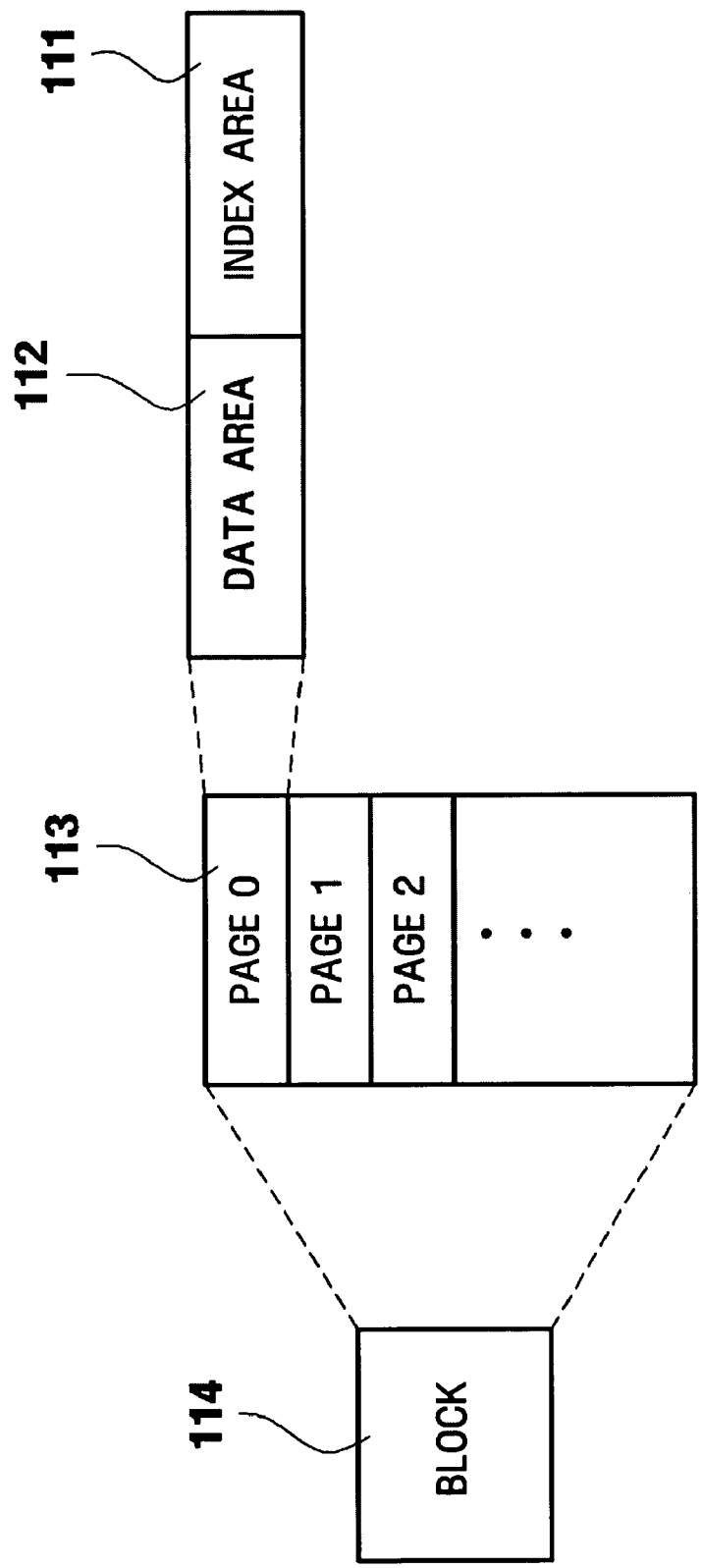
FIG. 5 is a diagram illustrating the structure of a typical flash memory.

FIG. 5 is a diagram illustrating the structure of a flash memory.

Referring to FIG. 5, a block 114 is comprised of a plurality of pages 113, and each of the pages 113 is comprised of a data area 111 and an index area 112.

The block 114 is a unit of data erasure, which is applied to the flash memory regardless of whether the flash memory is a small block flash memory or a large block flash memory.

Physical operations on the flash memory are performed on units of the pages 113. However, physical operations may be performed on different physical operation units for flash memories used in different systems.

Figure 6A:
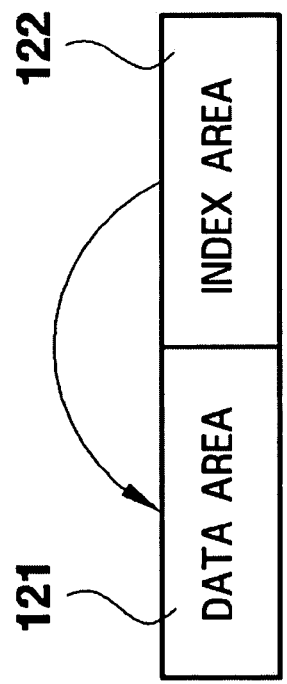
FIG. 6A is a diagram illustrating the relationship between a data area and an index area of a typical small block flash memory.

Referring to FIG. 6A, if the flash memory is a small block flash memory, each of the pages 113 may be comprised of a logical address 121 and an index area 122 corresponding to the logical address 121.

Figure 6B:
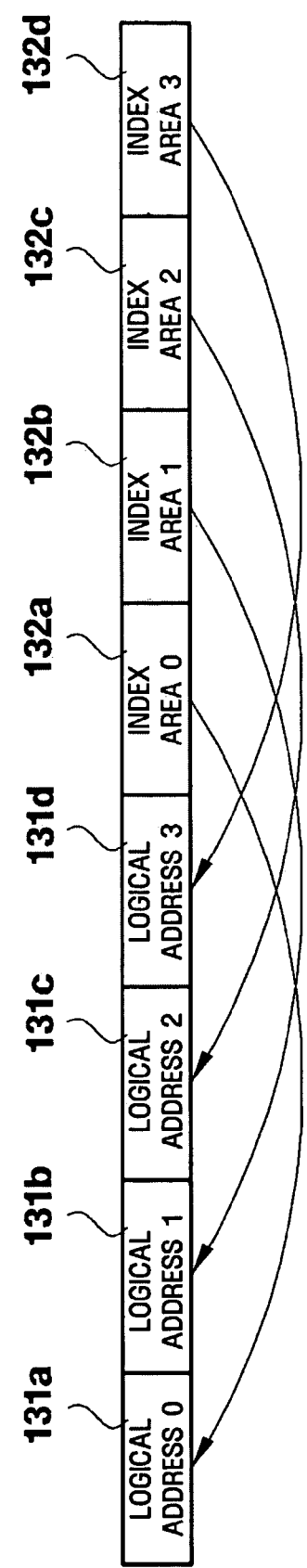
FIG. 6B is a diagram illustrating the relationship between a data area and an index area of a typical large block flash memory.

Referring to FIG. 6B, if the flash memory is a large block flash memory, each of the pages may be comprised of a plurality of logical addresses 131a through 131d and a plurality of index areas 132a through 132d, respectively corresponding to the logical addresses 131a through 131d.

A data operation is performed at each logical address of the flash memory, and after each data operation is finished, a mark value is recorded in a corresponding index area.

Accordingly, even when power supplied to the flash memory is cut off in the middle of the data operation, it is still possible to determine whether data stored at each logical address is valid.

Since the mark value is recorded in an index area whenever the data operation is performed, the total amount of data computation increases, which may result in deterioration of the performance of the flash memory.

A data recovery apparatus used for a flash memory, according to an exemplary embodiment of the present invention, which can minimize the total mount of data computation and can easily determine whether data stored at each logical address of the flash memory is valid, will now be described more fully with reference to FIG. 7.

Figure 7:
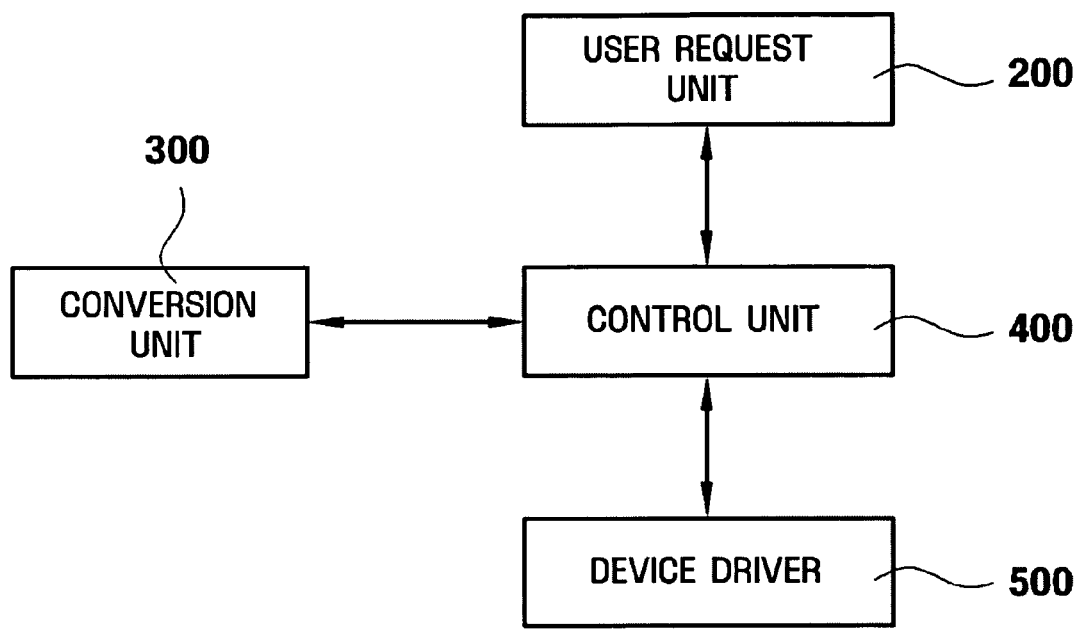
FIG. 7 is a block diagram of a data recovery apparatus used for a flash memory, according to an exemplary embodiment of the present invention.

As shown in FIG. 7, a data recovery apparatus used for a flash memory, according to an exemplary embodiment of the present invention includes a user request unit 200, a conversion unit 300, a device driver 500, and a control unit 400. In detail, the user request unit 200 issues a request for performing a data operation on the flash memory by specifying a predetermined logical address. The conversion unit 300 converts the logical address into a physical address. The device driver 500 controls the operation of the flash memory based on the physical address. The control unit 400 executes the data operation on the flash memory and records a mark value in an index area.

In this case, the control unit 400 performs the data operation in a predetermined data area on the flash memory and then records a mark value in an index area corresponding to the predetermined data area.

Here, if the flash memory is a small block flash memory having a logical operation unit identical with its physical operation unit, the control unit 400 performs a data operation at each of a plurality of consecutive logical addresses and then records a mark value in an index area corresponding to one of the consecutive logical addresses where the control unit 400 has most recently performed the data operation.

In addition, if the flash memory is a large block flash memory having a logical operation that is not the same as its physical operation unit, the control unit 400 may record a predetermined mark value in all index areas corresponding to consecutive logical addresses included in the physical operation unit on which the control unit 400 has most recently performed data operations. Otherwise, like in the small block flash memory, the control unit 400 may record the predetermined mark value in only one index area corresponding to a logical address where the control unit 400 has most recently performed the data operation.

Here, validity of data for each logical address of the flash memory is determined in the following manner. That is, if a value of 0 is recorded in an index area, data stored at a logical address corresponding to the index area is determined valid. If a value of 1 is recorded in the index area, the data stored at the logical address corresponding to the index area is determined invalid. Thus, data stored at a predetermined logical address can be determined valid if a value of 0 is recorded in an index area (hereinafter referred to as current index area) corresponding to the predetermined logical address, a value of 1 is recorded in the current index area, and a value of 0 is recorded in any index area subsequent to the current index area.

In addition, if a value of 1 is recorded in the current index area and data exists in a page subsequent to a page (hereinafter referred to as current page) where the current index area belongs, data stored at a predetermined logical address can be determined valid.

On the other hand, data stored at the current logical address can be determined invalid if a value of 1 is recorded in the current index area, no data exists in the page subsequent to the current page, and a value of 0 is not recorded in any of the index areas subsequent to the current index area.

Alternatively, the data operation may be performed first on a middle portion of the flash memory and then on the beginning or ending portion of the flash memory.

In this case, if the control unit 400 records a mark value only in an index area corresponding to a predetermined logical address where the control unit 400 has most recently performed the data operation, it can only be determined whether data respectively stored at consecutive logical addresses ahead of the predetermined logical address are valid.

Therefore, the control unit 400 should record the mark value in an index area corresponding to a logical address where the control unit 400 has started performing the data operation, as well as in the index area corresponding to the logical address where the control unit 400 has most recently performed the data operation, so that the validity of data respectively stored between logical addresses can be determined.

The operation of the data recovery apparatus according to the exemplary embodiment of the present invention will now be described.

Figure 8:
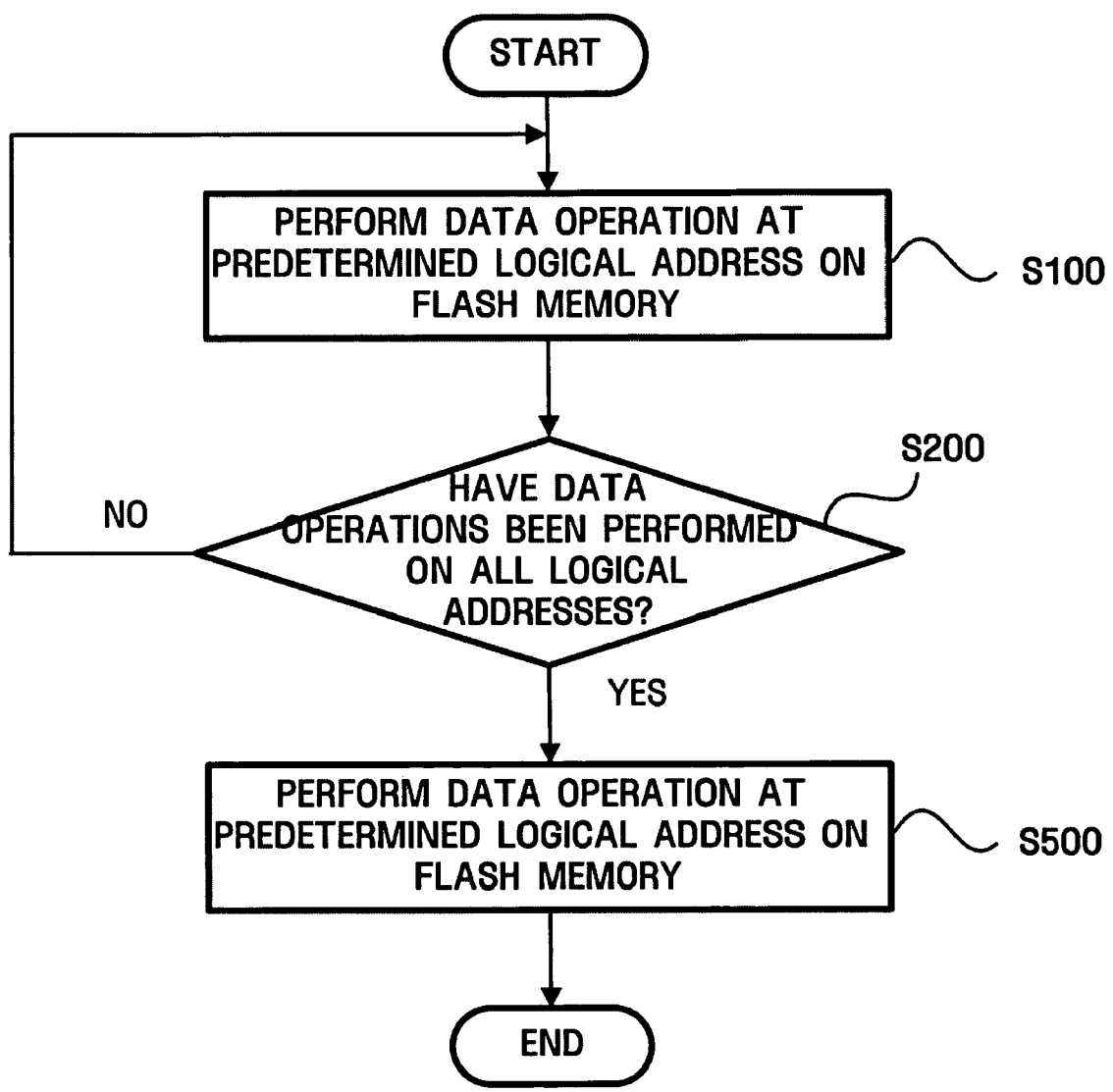
FIG. 8 is a flowchart of a data recovery method used for a flash memory, according to an exemplary embodiment of the present invention.

Referring to FIG. 8 showing a data recovery method used for a flash memory, according to an exemplary embodiment of the present invention, in operation S110, a data operation is performed at one of a plurality of logical addresses of the flash memory.

In operation S120, the data operation is repeatedly performed on the flash memory until all of the logical addresses of the flash memory undergo the data operation.

In operation S130, if the data operation has been performed on each of the logical addresses of the flash memory, a mark value is recorded in an index area corresponding to one of the logical addresses where the data operation has been most recently performed.

Suppose that the flash memory is a small block flash memory and a data operation is sequentially performed on logical addresses 0 through 5, as shown in FIG. 9A. Then, a mark value is recorded in an index area 620 corresponding to the logical address 5 (610).

According to the illustrative embodiment, when a data erasure operation is performed at a predetermined logical address of the flash memory, an index area corresponding to the predetermined logical address is set to an initial value of 1. Thereafter, if the data erasure operation has been successfully performed at a group of consecutive logical addresses ahead of the predetermined logical address and is finished at the predetermined logical address, the index area corresponding to the predetermined logical address is switched from 1 to 0.

Thus, the index area 620 corresponding to the logical address 5 (610) is switched from 1 to 0.

Suppose that the flash memory is a large block flash memory and a data operation is sequentially performed at logical addresses 0 through 9 and then sequentially performed at logical addresses 30 through 42, as shown in FIG. 9B. A value of 0 is recorded in index areas 630 and 640, respectively corresponding to the logical addresses 9 and 42, whereas a value of 1 is recorded in index areas respectively corresponding to the logical addresses 1 through 8 and 30 through 41. Alternatively, a value of 0 may be recorded in index areas respectively corresponding to all logical addresses included in a page where the logical addresses 9 and 42 belong.

Figure 10:
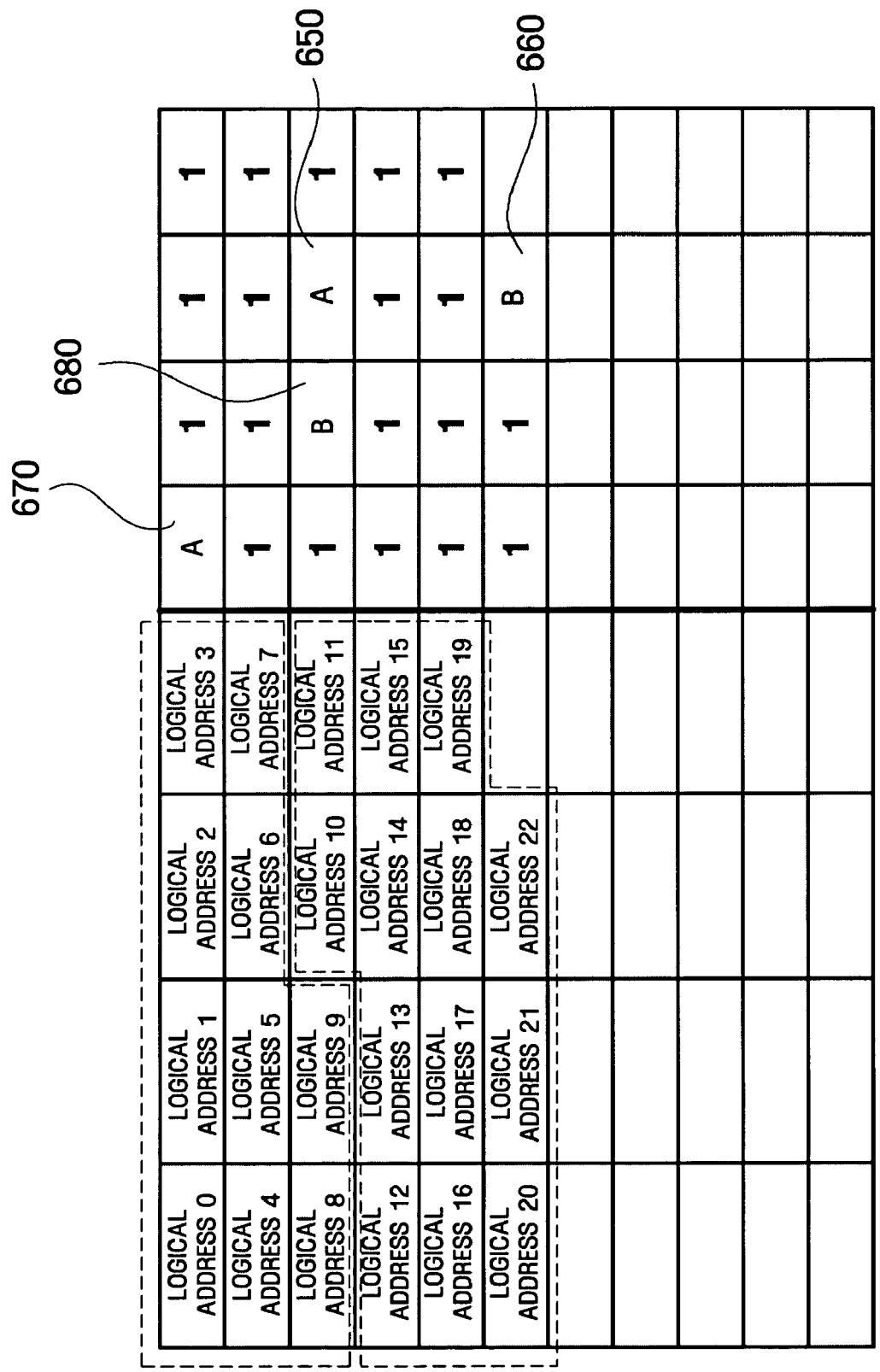
FIG. 10 is a diagram illustrating a method of recording a mark value in an index area of a flash memory, according to an exemplary embodiment of the present invention, in a case where the data operation has been performed first on a middle portion of the flash memory and then performed on other portions of the flash memory.

Meanwhile, suppose a data operation is performed first on a middle portion of the flash memory and then on other portions of the flash memory. For example, in a case where the data operation is sequentially performed at logical addresses 10 through 22 and then sequentially performed at logical addresses 0 through 9, as shown in FIG. 10, a mark value A is recorded in index areas 650 and 670 corresponding to the logical addresses 10 and 0, respectively, and a mark value B is recorded in index areas 660 and 680 corresponding to the logical addresses 22 and 9, respectively.

A method of determining whether data stored in the flash memory is valid, according to an exemplary embodiment of the present invention, will now be described more fully.

Figure 11A:
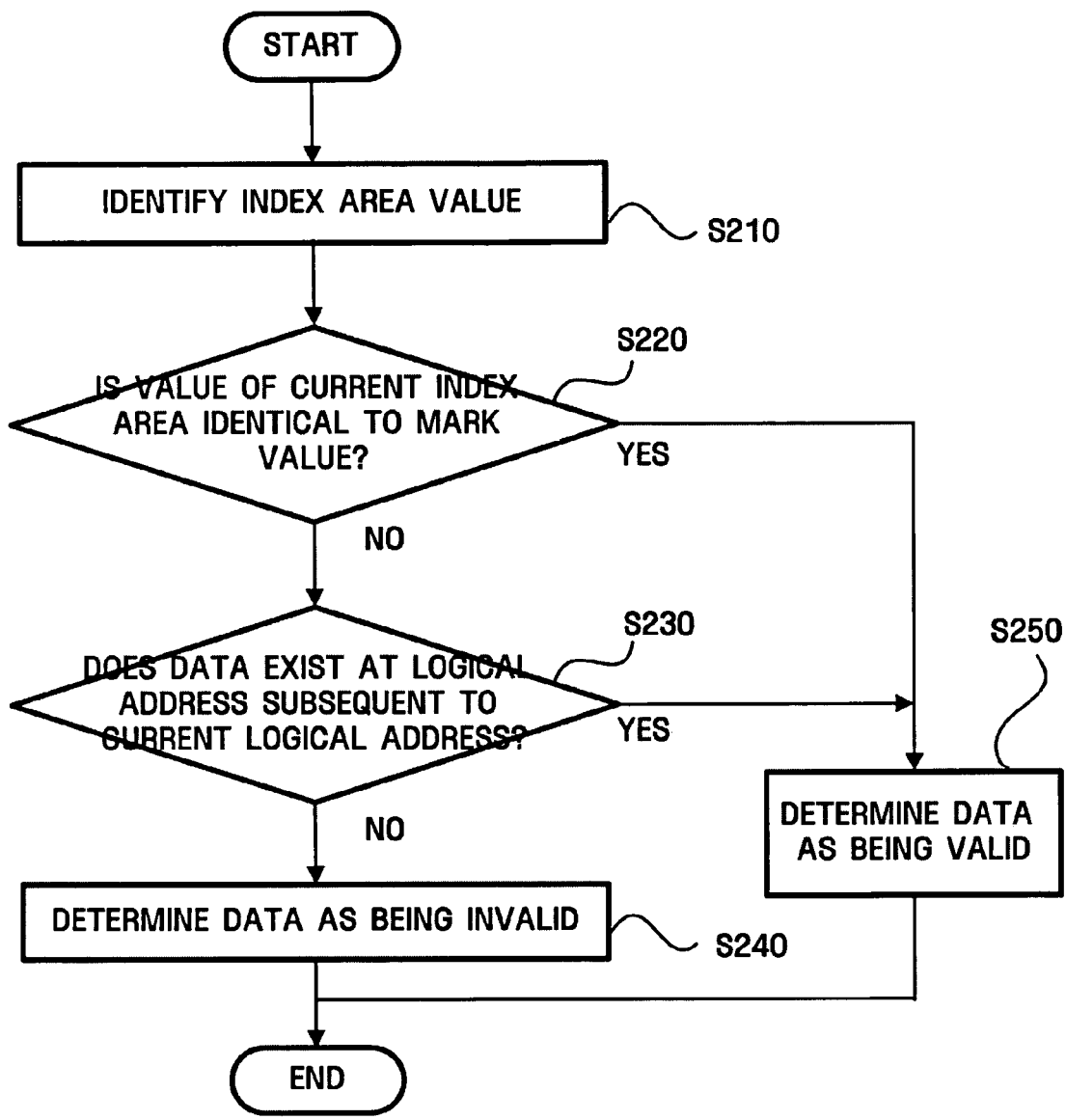
FIGS. 11A and 11B are flowcharts illustrating methods of determining whether data stored in a small block flash memory is valid, according to exemplary embodiments of the present invention.
Figure 11B:
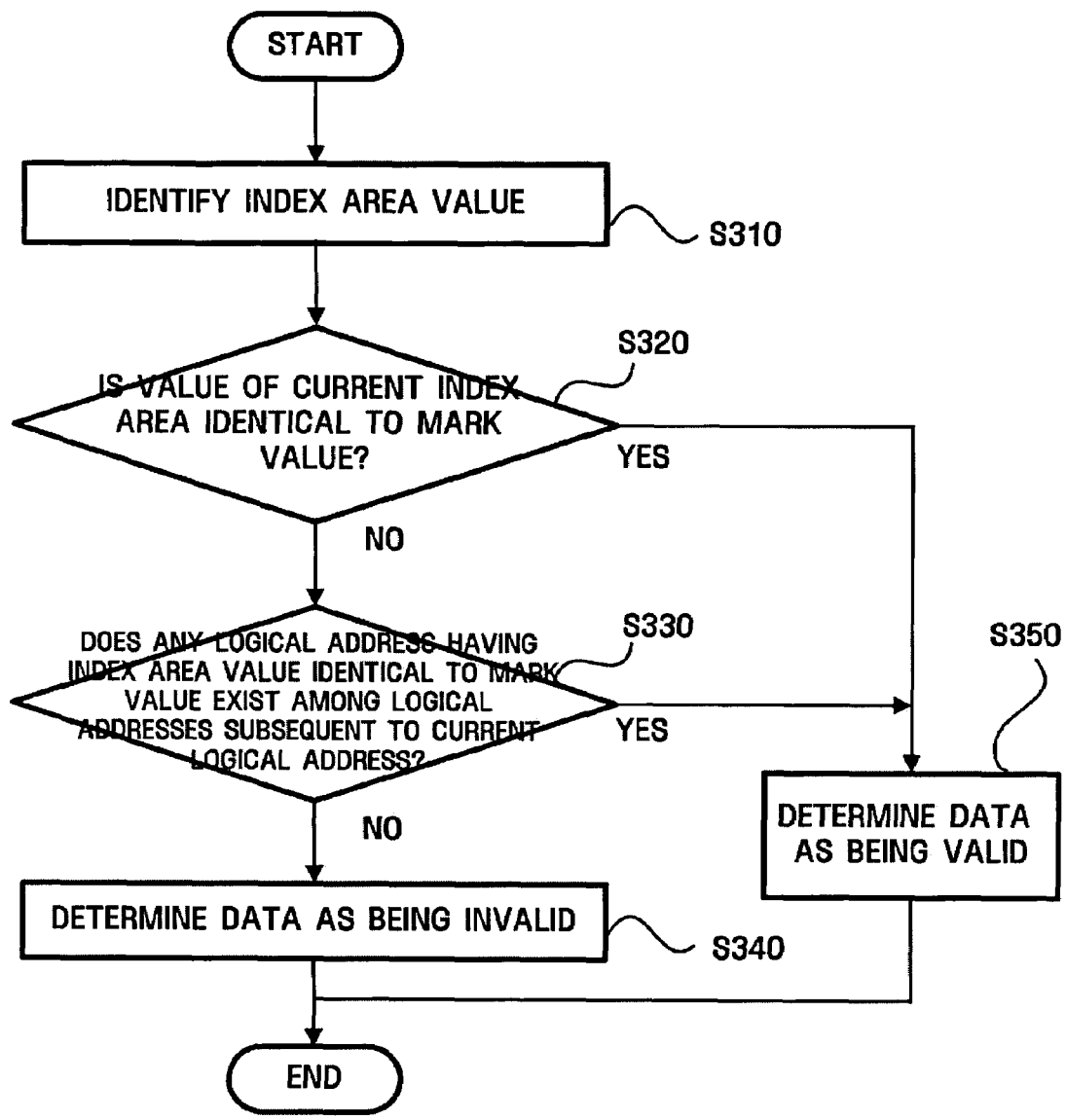

FIGS. 11A and 11B are flowcharts illustrating methods of determining whether data stored in a small block flash memory is valid according to exemplary embodiments of the present invention. As shown in FIG. 11A, in operation S210, a value of an index area (hereinafter referred to as current index area) is identified.

In operation S220, it is determined whether the value of the current index area is identical to a mark value.

That is, supposing that the data operation has been sequentially performed at a group of consecutive logical addresses prior to a logical address (hereinafter referred to as current logical address) corresponding to the current index area and the value of the current index area is switched from 1 to 0, it is determined in operation S220 whether the value of the current index area is 0. Here, if the value of the current index area is 0, data stored at the current logical address is determined valid.

In operation S230, if the value of the current index area is 1, it is determined whether data exists at a logical address subsequent to the current logical address.

In operation S240, if no data exists in the logical address subsequent to the current logical address, the data stored at the current logical address is determined invalid.

In operation S250, if the value of the current index area is 0 or if the value of the current index area is 1 and data exists in the logical address subsequent to the current logical address, the data stored at the current logical address is determined valid.

In an alternative embodiment, as shown in FIG. 11B, a value of an index area (hereinafter referred to as current index area) is identified in operation S310.

In operation S320, it is determined whether the value of the current index area is identical to a mark value.

That is, supposing that the data operation has been sequentially performed at a group of consecutive logical addresses prior to a logical address corresponding to the current index area and the value of the current index area is switched from 1 to 0, it is determined whether the value of the current index area is 0.

In operation S330, if the value of the current index area is 1, it is determined whether any of a plurality of index areas subsequent to the current index area has a value of 0.

Thereafter, in operation S340, if none of the index areas subsequent to the current index area has a value of 0, data stored at the current logical address is determined invalid.

In operation S350, if the value of the index area is 0 or if the value of the index area is 1 and at least one of the index areas subsequent to the current index area has a value of 0, the data stored at the current logical address is determined valid.

Such a data validity determination method can be applied to a large block flash memory in a similar manner.

Figure 12A:
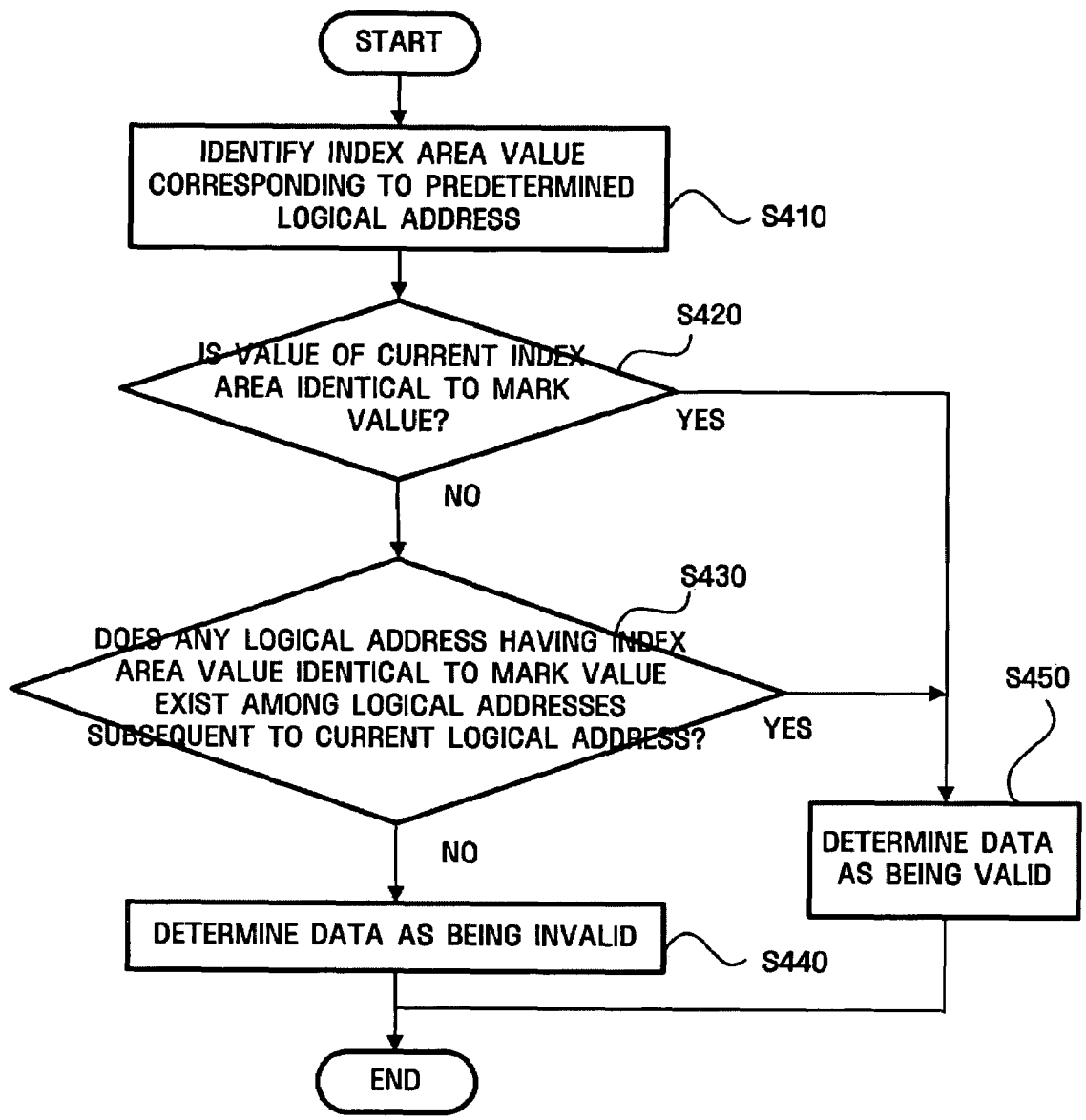
FIGS. 12A and 12B are flowcharts illustrating methods of determining whether data stored in a large block flash memory is valid, according to exemplary embodiments of the present invention.

First, in the case of a large block flash memory, as shown in FIG. 12A, in operation S410, a value of an index area (hereinafter referred to as current index area), corresponding to a predetermined logical address (hereinafter referred to as current logical address), is identified.

In operation S420, it is determined whether the value of the current index area is identical to a mark value.

That is, suppose that the data operation has been sequentially performed at a group of consecutive logical addresses ahead of the current logical address and is complete at the current logical address and the value of the current index area is switched from 1 to a value of 0. Then, it is determined whether the value of the current index area is 0 in operation S420.

Here, if the value of the index area is 0, data stored at the current logical address is determined valid.

In operation S430, if the value of the current index area is 1, it is determined whether any of a plurality of index areas subsequent to the current index area has a value of 0, by taking into consideration the logical and physical operation units of the large block flash memory.

Thereafter, in operation S440, if no logical addresses subsequent to the current logical address have an index area value of 0, data stored at the current logical address is determined invalid.

In operation S450, if the value of the index area is 0 or if the value of the index area is 1 and at least one of the index areas subsequent to the current index area has a value of 0, the data stored at the current logical address is determined valid.

Figure 12B:
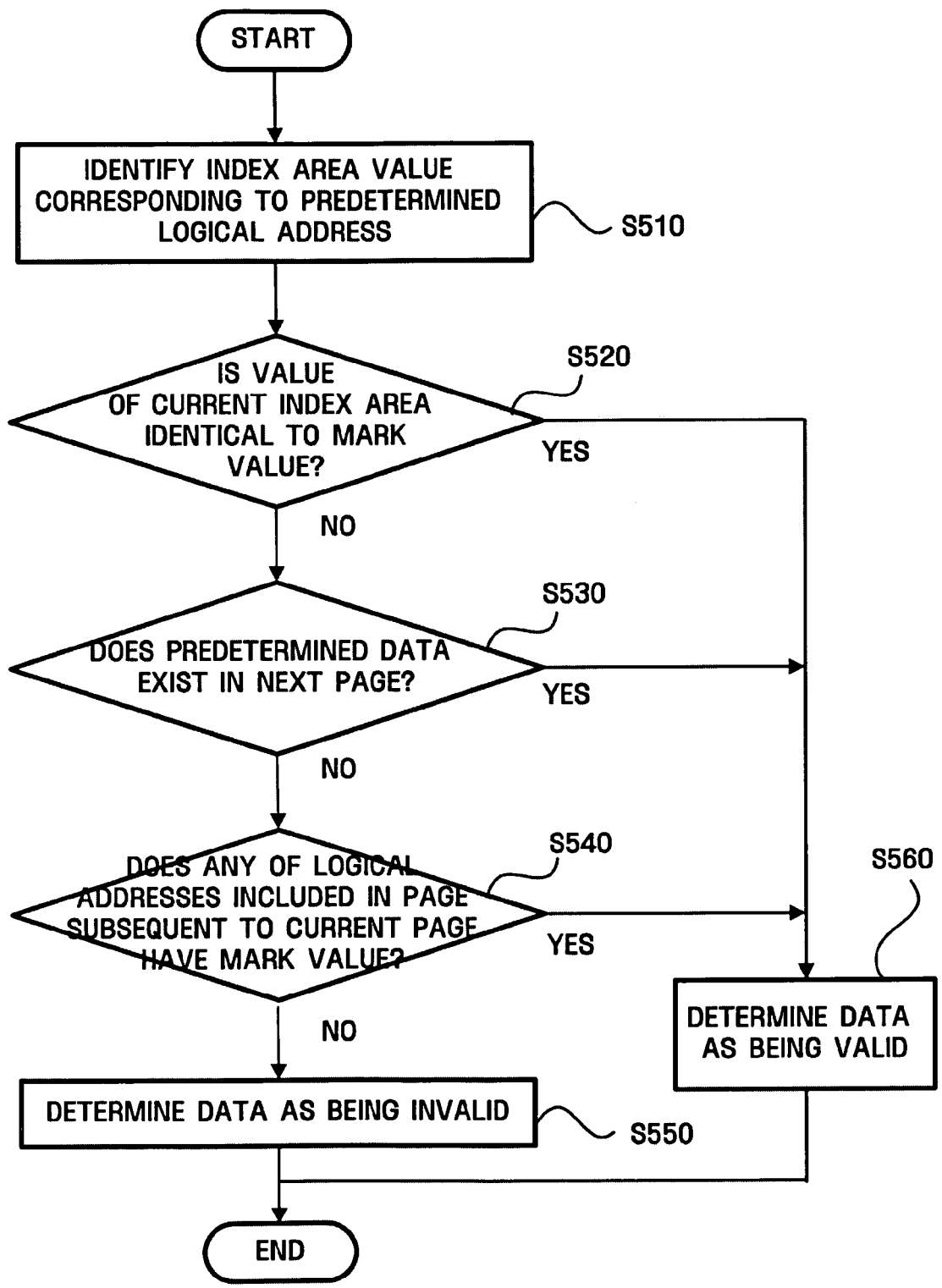

Alternatively, referring to FIG. 12B, a value of an index area (hereinafter referred to as current index area) is identified in operation S510.

In operation S520, it is determined whether the value of the current index area is identical to a mark value.

That is, suppose that the data operation has been sequentially performed at a group of consecutive logical addresses ahead of a logical address (hereinafter referred to as current logical address) corresponding to the current index area and is complete at the current logical address and the value of the current index area is switched from 1 to 0. Then, it is determined in operation S520 whether the value of the current index area is 0. If the value of the current index area is 0, data stored at the current logical address is determined valid.

In operation S530, if the value of the current index area is 1, it is determined whether data exists on a page subsequent to a page (hereinafter referred to as current page) where the current logical address belongs, by taking into consideration the physical and logical operation units of the large block flash memory.

In operation S540, if no data exists on the page subsequent to the current page, it is determined whether any of a plurality of logical addresses included in the page subsequent to the current page has the mark value.

In operation S550, if no data exists on the page subsequent to the current page and it is determined that none of the logical addresses included in the page subsequent to the current page has the mark value, the data stored at the current logical address is determined to be invalid.

In operation S560, if data exists on the page subsequent to the current page or if at least one of the index areas included in the page subsequent to the current page has the mark value, the data stored at the current logical address is determined valid.

While the data recovery apparatus and method used for a flash memory have been described with reference to the illustrative embodiments and drawings, it is to be appreciated that the above described embodiments are for purposes of illustration only and not to be construed as a limitation of the invention, and all variations and equivalents which fall within the range of the claims are intended to be embraced therein.

As described above, the data recovery apparatus and method used for a flash memory, according to the present invention, have the following aspects.

First, it is possible to minimize the total amount of data computation required for determining whether data respectively stored at a plurality of consecutive logical addresses in a flash memory are valid by performing a data operation at each of the logical addresses and then recording a mark value in only one of the logical addresses where the data operation has been most recently performed.

Second, it is possible to enhance the performance of the flash memory.

What is claimed is:

1. A data recovery apparatus used for a flash memory that includes data areas and index areas in which values indicating whether data stored in the respective data areas are valid are recorded, comprising:
   a controller that performs a data operation at each of a plurality of logical addresses, and if the data operations performed at the plurality of logical addresses are successful, records a mark value in a last index area of a plurality of index areas respectively corresponding to the plurality of logical addresses.

2. The data recovery apparatus of claim 1, wherein the data operation is first performed on a middle portion of the flash memory and then on other portions of the flash memory, and the mark value is recorded in one of the index areas corresponding to the middle portion of the flash memory.

3. The data recovery apparatus of claim 1, wherein said plurality of logical addresses are consecutive logical addresses.

4. A data recovery apparatus used for a flash memory that includes data areas and index areas in which values indicating whether data stored in the respective data areas are valid are recorded, comprising:
   a controller that determines whether data respectively stored at a plurality of logical addresses prior to a predetermined logical address, through a data operation, are valid based on a mark value recorded in an index area corresponding to the predetermined logical address.

5. The data recovery apparatus of claim 4, wherein the mark value is recorded in index areas respectively corresponding to first and last logical addresses of the plurality of logical addresses when performing the data operation first on a middle portion of the flash memory and then on other portions of the flash memory, and determining whether data respectively stored at at least one of the plurality of logical addresses between the first and last logical addresses are valid based on the index areas in which the mark value is stored.

6. The data recovery apparatus of claim 5, wherein it is determined whether data stored at the predetermined logical address is valid based on whether data exists at a logical address subsequent to the predetermined logical address.

7. The data recovery method of claim 4, wherein said plurality of logical addresses are a plurality of consecutive logical addresses.

8. A data recovery method used for a flash memory that includes data areas and index areas in which values indicating whether data stored in the respective data areas are valid are recorded, the data recovery method comprising:

performing a data operation at each of a plurality of logical addresses; and recording a mark value in a last index area of a plurality of index areas respectively corresponding to the plurality of logical addresses.

9. The data recovery method of claim 8, wherein, in the recording of the mark value, if the data operation is performed first on a middle portion of the flash memory and then on other portions of the flash memory, the mark value is recorded in an index area corresponding to the middle portion of the flash memory.

10. The data recovery method of claim 8, wherein said plurality of logical addresses are a plurality of consecutive logical addresses.

11. A data recovery method used for a flash memory that includes data areas and index areas in which values indicating whether data stored in the respective data areas are valid are recorded, the data recovery method comprising:

identifying a mark value recorded in an index area corresponding to a predetermined logical address; and determining whether data respectively stored at a plurality of logical addresses prior to the predetermined logical address, through a data operation, are valid based on the mark value.

12. The data recovery method of claim 11, wherein in the determining operation, it is determined whether the data respectively stored at the plurality of logical addresses are valid based on a mark value recorded in an index area corresponding to one of the plurality of logical addresses where the data operation has performed most recently.

13. The data recovery method of claim 12, wherein, in the determining operation, if the data operation is performed first on a middle portion of the flash memory and then on other portions of the flash memory, it is determined whether data stored in the flash memory are valid based on the mark value recorded in the index area corresponding to the middle portion of the flash memory.

14. The data recovery method of claim 12, wherein it is determined whether data stored at a predetermined logical address is valid based on whether data exists at a logical address subsequent to the predetermined logical address.

15. The data recovery method of claim 13, wherein it is determined whether data stored at a predetermined logical address is valid based on whether data exists at a logical address subsequent to the predetermined logical address.

16. The data recovery method of claim 12, wherein said plurality of logical addresses are a plurality of consecutive logical addresses.

* * * * *